United States Patent [19]

Hosking

[11] 4,454,442

[45] Jun. 12, 1984

[54] PIEZOELECTRIC RELAY USING EULER LEVER

[75] Inventor: Michael B. Hosking, Poway, Calif.

[73] Assignee: General Dynamics Electronics Division, San Diego, Calif.

[21] Appl. No.: 514,269

[22] Filed: Jul. 15, 1983

[51] Int. Cl.[3] .............................................. H01L 41/08

[52] U.S. Cl. .................................... 310/328; 310/346; 200/181

[58] Field of Search ............... 310/328, 330, 331, 346, 310/340; 200/181

[56] References Cited

U.S. PATENT DOCUMENTS

| | | | |
|---|---|---|---|
| 2,587,482 | 2/1952 | Keller | 310/328 X |
| 2,916,578 | 12/1959 | Crownover | 310/328 X |
| 3,688,135 | 8/1972 | Koda et al. | 310/330 |
| 4,193,703 | 3/1980 | Sakmann | 310/328 X |

*Primary Examiner*—Mark O. Budd
*Attorney, Agent, or Firm*—Brown & Martin

[57] ABSTRACT

A resilient, flexible elongate member forming a movable electrical contact is squeezed endwise by energizing a piezoelectric body supporting one end of the member. The mechanical advantage provided by this Euler lever construction permits the minute dimensional change in the piezoelectric body to open or close the relay by causing the member to bow outwardly so that its intermediate portion physically makes or breaks electrical connection with a fixed electrical contact. The relay provides improved signal integrity and isolation at lower power dissipation levels than solid state switching alternatives. Form A, B, C, and D and other contact variations are possible. A temperature compensated miniature package containing a plurality of such relays may also be constructed.

4 Claims, 10 Drawing Figures

PIEZOELECTRIC RELAY USING EULER LEVER

BACKGROUND OF THE INVENTION

The present invention relates to electromechanical switching devices, and more particularly, to a miniature relay in which contacts are opened and/or closed by the dimensional change in a piezoelectric material subjected to an electrical signal.

In general, a relay is an electromechanical device in which contacts are opened and/or closed by variations in the conditions of one electric circuit to thereby affect the operation of other devices in the same or other electric circuits. A relay can be considered to be a form of an amplifier, since a small amount of power to its input can control a much higher amount of power at its contacts. Multiple contact arrangements permit complex control and sequencing actions. One of the most important qualities of a relay is that it enables a high degree of isolation between its control input and its output.

In recent years, solid-state non-mechanical switching devices have come into wide use and their applications are extending rapidly. Nevertheless, relays are still used in large quantities in industrial controls, despite the fact that they have moving part, erodible contacts and relatively slow operation speeds compared to solid state switching devices.

A typical relay has a pivotally mounted armature having a first set of electrical contacts at one end. The other end of the armature is moved by a magnetic force produced by applying an electrical current to a coil wrapped around an iron core. A second set of contacts is mounted adjacent the first set of contacts so that the first and second sets will connect or disconnect upon either energization or de-energization of the coil. The armature carrying the first set of contacts is spring biased so that the first and second set of contacts are either normally open or normally closed.

Heretofore the structure of conventional relays has not lended itself well to miniaturization. However, because of the advantageous signal integrity and isolation capabilities of a relay, it would be desirable to have a miniature relay for use in a wide variety of electronic systems.

SUMMARY OF THE INVENTION

Accordingly, it is the primary object of the present invention to provide an improved relay structure.

Another object of the present invention is to provide a miniature relay.

Another object of the present invention is to provide a miniature relay which does not utilize any complex mechanical components.

Another object of the present invention is to provide a miniature relay which does not utilize electrical coils or solenoids.

Another object of the present invention is to provide a miniature relay in which contacts are opened and/or closed by dimensional changes in a piezoelectric material subjected to an electrical signal.

Another object of the present invention is to provide a miniature relay which utilizes a piezoelectric device to generate mechanical movement and which is adaptable to various contact arrangements.

In the illustrated embodiments of my invention, a resilient, flexible elongate member forming a movable electrical contact is squeezed endwise by energizing a piezoelectric body supporting one end of the member. The mechanical advantage provided by this Euler lever construction permits the minute dimensional change in the piezoelectric body to open or close the relay by causing the member to bow outwardly so that its intermediate portion physically makes or breaks electrical connection with a fixed electrical contact. The relay provides improved signal integrity and isolation at lower power dissipation levels than solid state switching alternatives. Form A, B, C, and D and other contact arrangements are possible. A temperature compensated miniature package containing a plurality of such relays may also be constructed.

Figure 1:
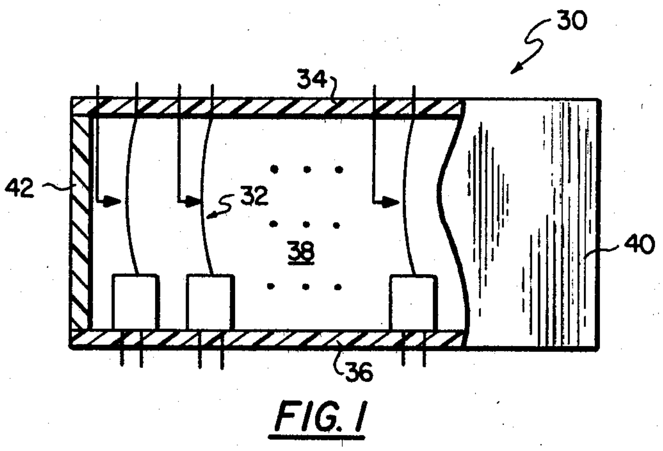
FIG. 1 is a simplified cross-section view of a miniature package housing a plurality of relays constructed in accordance with the present invention.

FIGS. *2a* and *2b* are schematic diagrams of a first embodiment of my invention configured in an "A" form contact arrangement. The first embodiment closes when energized.

FIGS. *3a* and *3b* are schematic diagrams of a second embodiment of my invention configured in a "B" form contact arrangement. The second embodiment is closed when de-energized.

FIGS. *4a* and *4b* are schematic diagrams of a third embodiment of my invention configured in a "C" form contact arrangement. The third embodiment represents a "change-over make after break" type relay.

FIGS. *5a, 5b* and *5c* are schematic diagrams of a fourth embodiment of my invention configured in a "D" form contact arrangement. The fourth embodiment represents a "change-over make before break" type relay.

Like reference numerals throughout the figures refer to like parts.

DESCRIPTION OF THE PREFERRED EMBODIMENTS

My invention utilizes a body of piezoelectric material as the driving element to mechanically close and/or open electric contacts. A piezoelectric material is generally a crystalline structure which, when distorted physically, generates a small voltage in proportion to the distorting force. Conversely, the application of an electrical signal to a body of piezoelectric material results in a deformation or small dimensional change in the shape of the body. In the present invention, piezoelectric ceramic material is preferred over the strongly piezoelectric non-ferroelectric single crystals such as quartz, lithium sulfate, lithium niobate, lithium tantalate, and zinc oxide. Piezoelectric ceramics have achieved high reproducibility and relatively low cost. With piezoelectric ceramics, the polar axis is parallel to the original DC polarizing field. The deformations that can be achieved with piezoelectric ceramics are generally greater than that of other piezoelectric materials, however they are still relatively small. Therefore, some means of mechanical amplification is required if a body of piezoelectric material is to be used as the motion inducing device in a miniature relay.

In the illustrated embodiments of my invention, the mechanical amplification means is provided by an Euler lever. This lever takes the form of a resilient, flexible elongate member which is squeezed endwise to produce a bowing action. This results in a significantly greater transverse movement of the intermediate portion of the member than the expansion or deformation movement of the piezoelectric body.

Figure 2A:
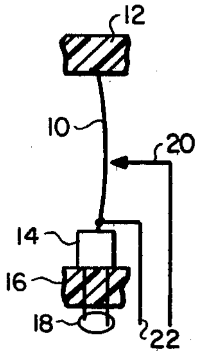
Figure 2B:
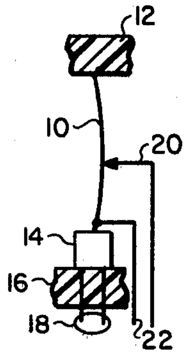

Referring to FIGS. 2*a* and 2*b*, a first embodiment of my relay configured in an "A" contact arrangement includes an elongate, flexible, resilient member 10 whose ends are mounted to a rigid support 12 and a body 14 of piezoelectric material, respectively. The body of piezoelectric material 14 is in turn mounted on a rigid support 16. Supports 12 and 16 may be rigidly connected as described hereafter in conjunction with FIG. 1. The member 10 may be a solid thin strip of metal, or may be made of a non-metallic strip coated with metal. The member 10 may also have other constructions. Leads 18 enable the body 14 of piezoelectric material to be subjected to an electrical signal. When the body of piezoelectric material is unexcited, preferably the resilient, flexible member 10 is slightly bowed or deformed in a slight arc as illustrated in FIG. 2*a*. This will ensure that the elongate member bows in the correction direction. When a suitable electrical signal is applied to the body 14 of the piezoelectric material via leads 18, the body expands in height, thereby squeezing the member 10 endwise and causing its intermediate portion to bow outwardly and physically connect with fixed electric contact 20 as illustrated in FIG. 2*b*. Thus, current can flow through a lead 22 connected to one end of the flexible member 10, through the flexible member and through the contact 20.

Referring still to FIGS. 2*a* and 2*b*, the resilient, flexible member 10 may be viewed as an Euler lever which serves as a means for mechanically amplifying the very slight longitudinal expansion which occurs in the body 14 of piezoelectric material when excited by a suitable electrical signal. It will be understood that the body 14 is preferably made of a doped ceramic piezoelectric material selected to maximize longitudinal expansion. Similarly, the materials and dimensioning of the resilient, flexible member 10, the amount of its relaxed curve, and the spacing from the fixed contact 20 must be carefully selected within the parameters of the system so that the movable contact in the form of the member 10 and the fixed contact 20 will close when the piezoelectric body is energized.

Figure 3A:
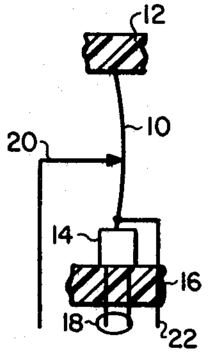
Figure 3B:
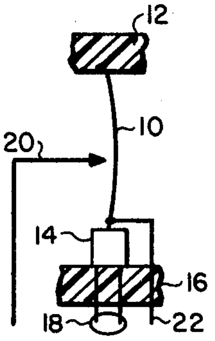

Referring to FIGS. 3*a* and 3*b*, the second embodiment of my invention is configured in a "B" contact arrangement. The second embodiment is similar to the first embodiment, except that the second embodiment of my relay opens when the piezoelectric body 14 is energized.

Figure 4A:
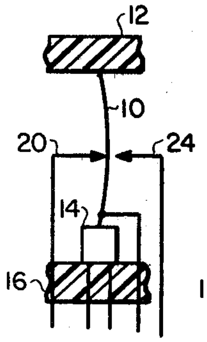
Figure 4B:
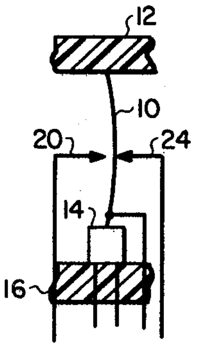

Referring to FIGS. 4*a* and 4*b*, a third embodiment of my invention is configured in a "C" contact arrangement. In the third embodiment, there are two fixed contacts 20 and 24. In the third embodiment, when the piezoelectric body 14 is not energized, a circuit exists through lead 22 and fixed contact 20. When the piezoelectric body 14 is energized, a circuit exists through lead 22 and fixed contact 24.

Figure 5A:
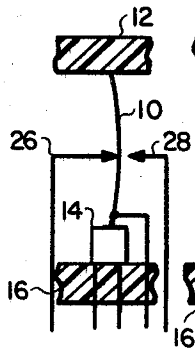
Figure 5B:
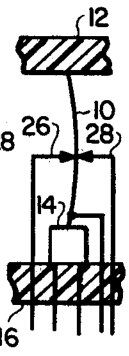
Figure 5C:
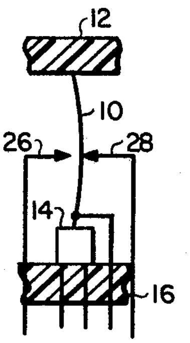

Referring to FIGS. 5*a*, 5*b* and 5*c*, a fourth embodiment of my invention is configured in a "D" contact arrangement. It is similar to the other embodiments, except that contacts 26 and 28 on either side of the movable contact 20 enable a "change-over make before break" operation.

FIG. 1 illustrates a miniature relay package 30 which houses a plurality of individual "A" contact configuration relays 32 of the type illustrated in FIGS. 2*a* and 2*b*. The plurality of relays 32 are illustrated by the dots in FIG. 1. The relays are mounted between upper and lower spaced apart plates 34 and 36 rigidly connected to side plates 38 and 40. Preferably, the side plates are made of the same material as the resilient, flexible members or Euler levers of each of the relays to allow for temperature compensation. In other words, by making the Euler levers and the side plates out of the same material, the relays will not be inadvertently closed or opened as a result of any differential thermal expansion in the levers and the side plates. End plates such as 42 are provided to completely enclose the relays to prevent dust or other foreign matter from interfering with proper operation of the relays. By way of example, the miniature relay package 30 may measure one inch by one inch by one inch and contain one-hundred individual relays 32. Plates 34 and 36 may be made of ceramic or other insulating material. In other words, these plates may be made of ceramic or other insulating material with a surface pattern and plated through holes made of conductive metal such as copper, deposited and etched to delineate the necessary input and output leads.

Thus, my invention provides a highly reliable, miniature relay which enables circuit isolation and improved signal integrity in a wide variety of electronic systems and applications such as multiple buss switching or miniature matrix switching. My relay can be fabricated in a very small size. For example, a single relay could occupy a 1/10 square inch base and be only 4/10 inches in height. Fifty such relays could be constructed in a strip only five inches long by 1/10 inch wide. Because of the unique properties of the piezoelectric motion producing body, my relay can be fabricated such that it dissipates less power than solid state switching devices which might otherwise be used to accomplish the same switching function.

Having described preferred embodiments of my invention, modifications and adaptations thereof will occur to those skilled in the art. For example, additional linkages or levers could be provided to generate further motion increase and/or electric isolation. The contacts may be solid metallic, plated, metal in a liquid state such as mercury, conductive gas, or other types. Therefore, the protection afforded my invention should only be limited in accordance with the scope of the following claims.

I claim:

1. A relay comprising:
- a single resilient, flexible elongate member made of a dielectric material;
- an electrically conductive material mounted on the intermediate portion of the elongate member to provide a movable electrical contact;
- means for supporting one end of the elongate member;
- at least one fixed electrical contact positioned adjacent the movable electrical contact on the intermediate portion of the elongated member;
- a solid piezoelectric body supporting the other end of the member;
- a substantially rigid structural element holding the supporting means and the piezoelectric body spaced apart with the elongate member extending therebetween and slightly bowed toward the fixed electrical contact prior to energization of the piezoelectric body;
- the piezoelectric body being expandable longitudinally upon being energized with a predetermined electrical signal to squeeze the elongate member endwise and cause it to further bow sufficiently to bring the movable electrical contact on the intermediate portion of the elongate member into or out of contact with the fixed electrical contact;

and the rigid structural element and the elongate member being made of the same dielectric material to thereby prevent inadvertent connection or disconnection between the movable and fixed electric contacts due to temperature variations.

2. A relay according to claim 1 wherein the movable electric contact comprises a metal coat on the elongate member.

3. A relay according to claim 1 wherein the supporting means and rigid structural element comprise a package which completely encloses the elongate member and electrical contacts.

4. A relay according to claim 3 wherein the package includes upper and lower spaced apart plates between which the elongate member extends, the plates having a surface pattern and plated through holes made of an electrically conductive material to provide input and output leads to the electrical contacts and the piezoelectric body.

* * * * *